(12) United States Patent
Kim et al.

(10) Patent No.: US 11,320,712 B2
(45) Date of Patent: May 3, 2022

(54) DISPLAY DEVICE, METHOD FOR FORMING A PATTERN AND METHOD FOR MANUFACTURING DISPLAY DEVICE

(71) Applicant: Samsung Display Co., LTD., Yongin-si (KR)

(72) Inventors: Seon-Il Kim, Hwaseong-si (KR); Sung Won Cho, Hwaseong-si (KR); Sang Gab Kim, Seoul (KR); Su Bin Bae, Hwaseong-si (KR); Yu-Gwang Jeong, Anyang-si (KR); Dae Won Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/905,306

(22) Filed: Jun. 18, 2020

(65) Prior Publication Data

US 2021/0132424 A1    May 6, 2021

(30) Foreign Application Priority Data

Oct. 30, 2019    (KR) .................. 10-2019-0136543

(51) Int. Cl.
  *G02F 1/1368*    (2006.01)
  *H01L 51/56*    (2006.01)
  (Continued)

(52) U.S. Cl.
  CPC ...... *G02F 1/1368* (2013.01); *G02F 1/136286* (2013.01); *H01L 27/3276* (2013.01);
  (Continued)

(58) Field of Classification Search
  CPC ... H01L 51/56; H01L 27/127; H01L 27/1259; G03F 7/00; G02F 1/133351;
  (Continued)

(56) References Cited

U.S. PATENT DOCUMENTS

2007/0012967 A1* 1/2007 Kim ..................... H01L 29/458
                                                                       257/291
2011/0133193 A1* 6/2011 Song ................. H01L 29/78669
                                                                        257/59

(Continued)

FOREIGN PATENT DOCUMENTS

KR    10-2007-0075808    7/2007
KR    10-2013-0081492    7/2013
(Continued)

*Primary Examiner* — Mariam Qureshi
(74) *Attorney, Agent, or Firm* — Kile Park Reed & Houtteman PLLC

(57) ABSTRACT

A display device includes a thin film transistor on a base substrate and a signal wiring electrically connected to the thin film transistor. The signal wiring includes a main conductive layer including copper, and a capping layer including titanium the capping layer overlapping a portion of an upper surface of the main conductive layer. The signal wiring has a taper angle in a range of about 70° to about 90°. A thickness of the capping layer is in a range of about 100 Å to about 300 Å, and a thickness of the main conductive layer is in a range of about 1,000 Å to about 20,000 Å.

9 Claims, 15 Drawing Sheets

(51) Int. Cl.
*G02F 1/1362* (2006.01)
*H01L 51/52* (2006.01)
*H01L 27/32* (2006.01)

(52) U.S. Cl.
CPC .......... *H01L 51/5246* (2013.01); *H01L 51/56* (2013.01); *G02F 2202/28* (2013.01); *H01L 2227/323* (2013.01)

(58) Field of Classification Search
CPC ...... B32B 2457/20; G06F 2203/04103; B05D 1/00; C23C 14/00
See application file for complete search history.

(56) References Cited

U.S. PATENT DOCUMENTS

2016/0197165 A1* 7/2016 Kim .................... H01L 21/3081
438/163
2016/0254296 A1* 9/2016 Liu ....................... H01L 27/124
438/158

FOREIGN PATENT DOCUMENTS

| KR | 10-2014-0135037 | 11/2014 |
| KR | 10-2015-0025490 | 3/2015 |

* cited by examiner

DISPLAY DEVICE, METHOD FOR FORMING A PATTERN AND METHOD FOR MANUFACTURING DISPLAY DEVICE

CROSS-REFERENCE TO RELATED APPLICATION(S)

This application claims priority to and benefits of Korean Patent Application No. 10-2019-0136543 under 35 U.S.C. § 119, filed on Oct. 30, 2019 in the Korean Intellectual Property Office, the entire contents of which are incorporated herein by reference.

BACKGROUND

1. Technical Field

Embodiments relate to a display device, and a method for forming a pattern, and a method for manufacturing a display device.

2. Description of the Related Art

Display panels having a high resolution, for example, 4 k or 8 k, are currently being developed due to the increased demand for such high resolution display devices.

However, a high resolution display panel may have a relatively larger area of metal wirings as compared with other display panels. The relatively large area of metal wirings may result in reflectance, which may ultimately deteriorate display quality, especially a black image quality.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device having a reduced reflectance for an external light.

Embodiments provide a method for forming a pattern, which may be used for manufacturing the display device.

Embodiments provide a method for manufacturing the display device.

According to an embodiment, a display device may include a thin film transistor disposed on a base substrate; and a signal wiring electrically connected to the thin film transistor. The signal wiring may include: a main conductive layer including copper; and a capping layer including titanium, the capping layer may overlap a portion of an upper surface of the main conductive layer. The signal wiring may have a taper angle in a range of about 70° to about 90°. A thickness of the capping layer may be in a range of about 100 Å to about 300 Å, and a thickness of the main conductive layer may be in a range of about 1,000 Å to about 20,000 Å.

In an embodiment, the signal wiring may include an adhesion-improving layer including at least one of titanium, molybdenum and tungsten and may be disposed below the main conductive layer.

In an embodiment, a thickness of the adhesion-improving layer may be in a range of about 50 Å to about 500 Å.

In an embodiment, the capping layer may overlap an entire upper surface of the main conductive layer.

In an embodiment, the main conductive layer may include a first portion and a second portion, the first portion and the second portion may have different taper angles from each other.

In an embodiment, the first portion may be disposed on the second portion, and a first taper angle of the first portion may be larger than a second taper angle of the second portion.

In an embodiment, the signal wiring may include: a data line, which may be electrically connected to a source electrode of the thin film transistor, or a gate line, which may be electrically connected to a gate electrode of the thin film transistor.

According to an embodiment, a method for forming a pattern is provided. According to the method, a multi-layered structure may include forming a copper-containing layer and a titanium-containing layer on the copper-containing layer. A photoresist pattern may be formed on the multi-layered structure. The multi-layered structure may be wet-etched by applying the photoresist pattern as a mask to form a metal pattern having an upper tip protruding. The photoresist pattern may be partially removed to expose an upper surface of the upper tip and to form a remaining photoresist pattern. The metal pattern may be dry-etched with an etching gas by applying the remaining photoresist pattern as a mask to remove the upper tip.

The etching gas may include a fluorine-containing compound and a chlorine-containing compound.

In an embodiment, the fluorine-containing compound may include at least one of $SF_6$, $NF_3$ and $CF_4$, and the chlorine-containing compound may include at least one of $Cl_2$ and $BCl_3$.

In an embodiment, the etching gas may include $SF_6$ and $Cl_2$.

In an embodiment, a flow ratio of the fluorine-containing compound and the chlorine-containing compound may be in a range of about 1:9 to about 3:7.

In an embodiment, the dry-etching of the metal pattern may include a first dry-etching and a second dry-etching with respect to the metal pattern. A flow ratio of the fluorine-containing compound and the chlorine-containing compound may be in a range of about 1:9 to about 2:8 when performing the first dry-etching. A flow ratio of the fluorine-containing compound and the chlorine-containing compound may be in a range of about 2:8 to about 3:7 when performing the second dry-etching.

According to an embodiment, a method for manufacturing a display device is provided. The method may include forming a doped silicon layer on an amorphous silicon layer. A source metal layer may be formed on the doped silicon layer. The source metal layer may include a copper-containing layer and a titanium-containing layer on the copper-containing layer. A photoresist pattern may be formed on the source metal layer. The source metal layer may be wet-etched by applying the photoresist pattern as a mask to form a preliminary source pattern and a data line. The photoresist pattern may be partially removed to partially expose an upper surface of the preliminary source pattern and to form a first remaining photoresist pattern. The preliminary source pattern may be wet-etched by applying the first remaining photoresist pattern as a mask to form a source electrode and a drain electrode and to partially expose an upper surface of the doped silicon layer. The first remaining photoresist pattern may be partially removed to expose an upper tip of a source metal pattern including the source electrode, the drain electrode and the data line and to form a second remaining photoresist pattern. The source metal pattern may be dry-etched with an etching gas by applying the second remaining photoresist pattern as a mask to remove the upper tip.

The etching gas may include a fluorine-containing compound and a chlorine-containing compound.

The fluorine-containing compound may include at least one of $SF_6$, $NF_3$ and $CF_4$, and the chlorine-containing compound may include at least one of $Cl_2$ and $BCl_3$.

The etching gas may include $SF_6$ and $Cl_2$.

A flow ratio of the fluorine-containing compound and the chlorine-containing compound may be in a range of about 1:9 to about 3:7.

The dry-etching of the source metal pattern may include a first dry-etching and a second dry-etching with respect to the source metal pattern, wherein a flow ratio of the fluorine-containing compound and the chlorine-containing compound may be in a range of about 1:9 to about 2:8 when performing the first dry-etching, and a flow ratio of the fluorine-containing compound and the chlorine-containing compound may be in a range of about 2:8 to about 3:7 when performing the second dry-etching.

The doped silicon layer may be partially removed to expose the amorphous silicon layer when dry-etching the source metal pattern.

The source metal layer may include an adhesion-improving layer including at least one of titanium, molybdenum and tungsten and disposed below the copper-containing layer.

The signal wiring may have a taper angle in a range of about 70° to about 90°, a thickness of the titanium-containing layer may be in a range of about 100 Å to about 300 Å, a thickness of the copper-containing layer may be in a range of about 1,000 Å to about 20,000 Å, and a thickness of the adhesion-improving layer may be in a range of about 50 Å to about 500 Å.

According to embodiments, a metal pattern of a display device may include a low reflectance layer including titanium. Thus, reflectance of an external light by a metal pattern may be reduced thereby improving a display quality of a display device.

Furthermore, an upper tip of a metal pattern having a multi-layered structure including an upper layer containing titanium and a lower layer containing copper may be effectively removed.

Furthermore, a taper angle of the metal pattern may be increased thereby improving characteristics for a signal wiring.

BRIEF DESCRIPTION OF THE DRAWINGS

Features of one or more embodiments will be more clearly understood from the following detailed description taken in conjunction with the accompanying drawings.

DETAILED DESCRIPTION OF THE EMBODIMENTS

Figure 1:
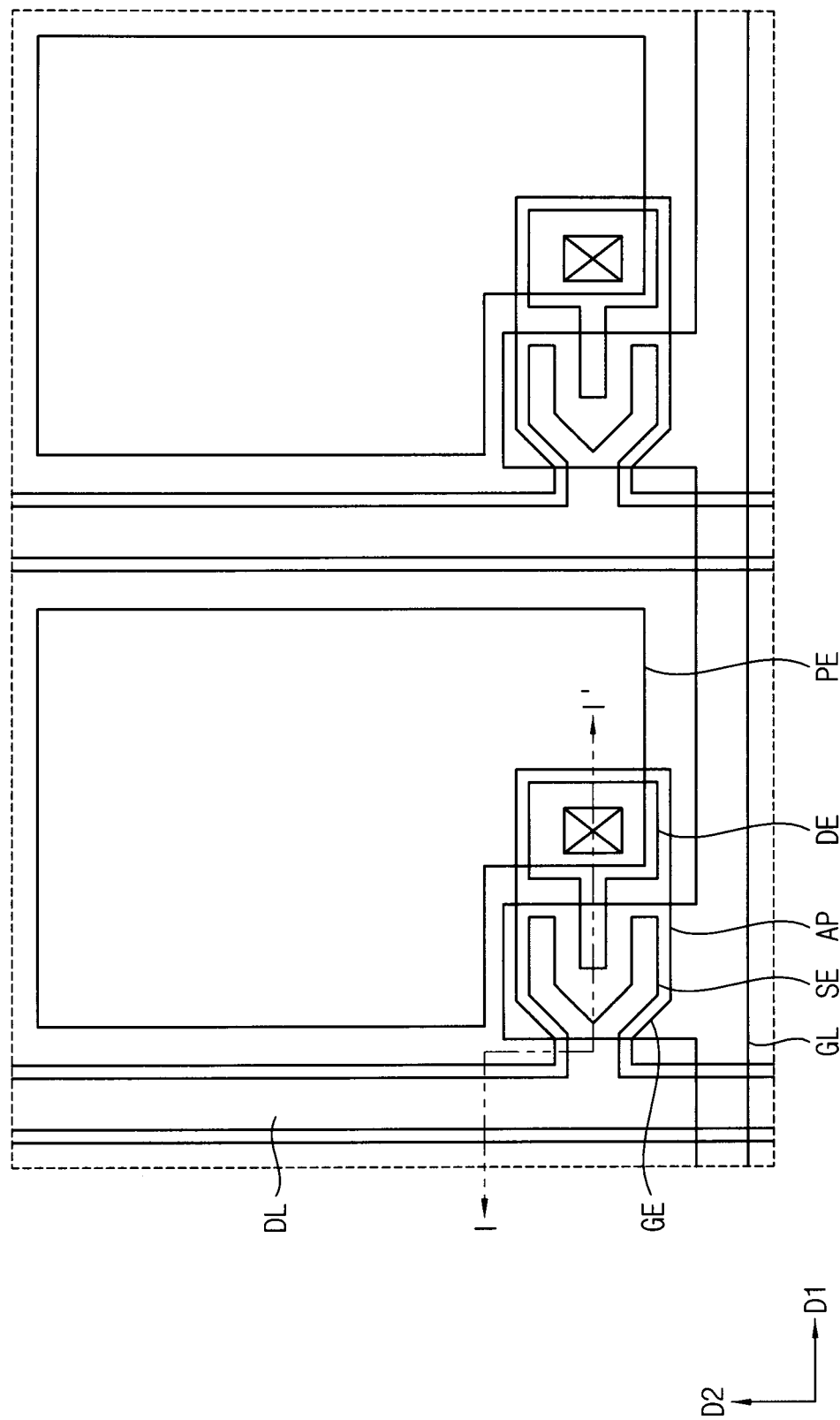
FIG. 1 is a plan view illustrating a display device according to an embodiment.

A display device and a method for manufacturing a display device according to embodiments will be described hereinafter with reference to the accompanying drawings, in which embodiments are shown.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further, when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
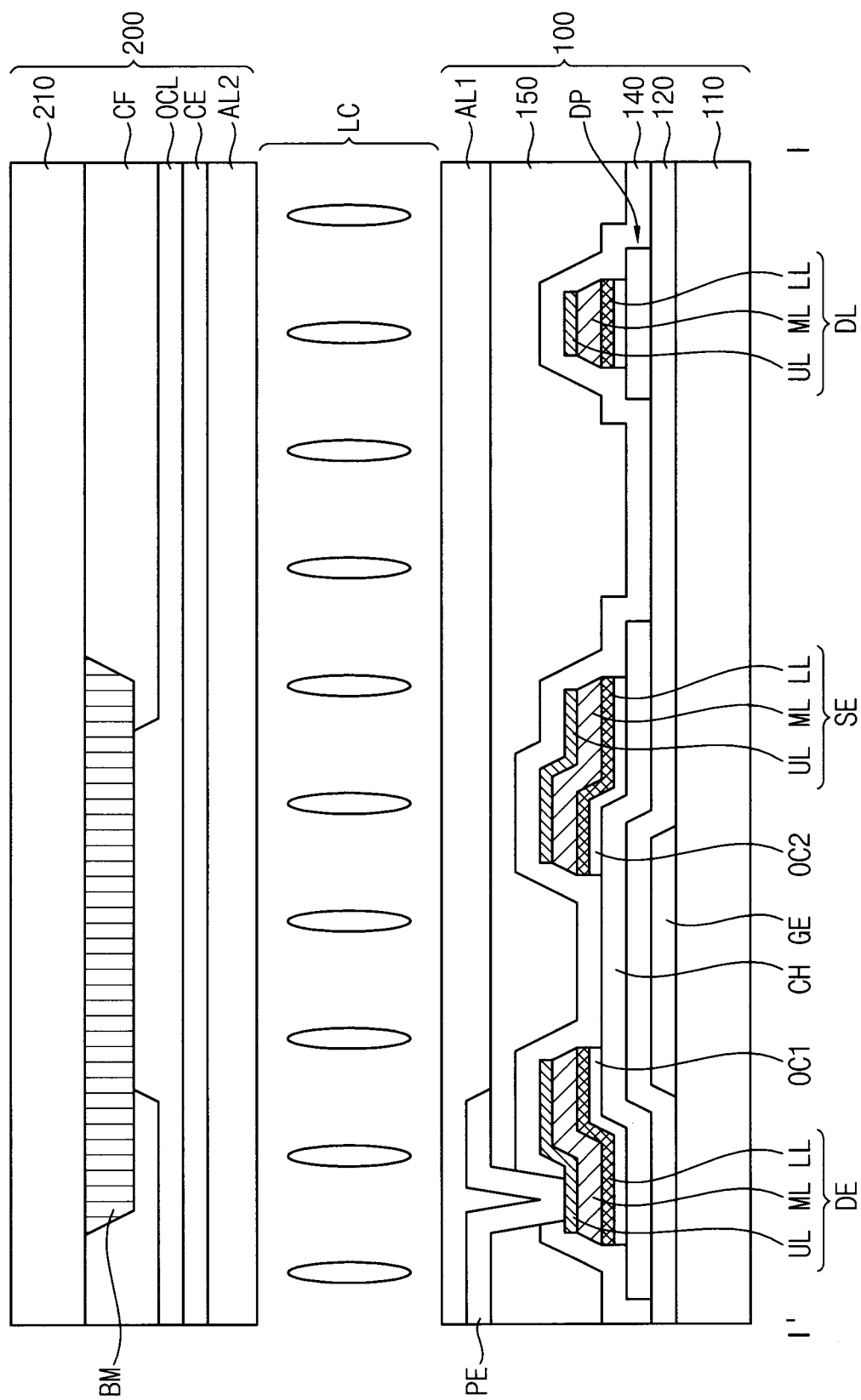
FIG. 2 is a schematic cross-sectional view taken along the line I-I' of FIG. 1.

FIG. 1 is a plan view illustrating a display device according to an embodiment. FIG. 2 is a schematic cross-sectional view taken along the line I-I' of FIG. 1.

In an embodiment, a display device may be a liquid crystal display device. For example, the display device may include a display panel and a backlight assembly providing light to the display panel. However, the disclosure is not limited thereto.

Referring to FIGS. 1 and 2, the display panel may include a display substrate 100 including an array of pixels, an opposing substrate 200 combined with the display substrate 100 and a liquid crystal layer LC interposed or disposed between the display substrate 100 and the opposing substrate 200.

A pixel may include a switching element and a pixel electrode PE electrically connected to the switching element. The display substrate 100 or the opposing substrate 200 may include a common electrode CE. In an embodiment, the common electrode CE may be disposed on the opposing substrate 200. However, embodiments are not limited thereto. For example, the common electrode CE may be included in the display substrate 100. The common electrode CE may have a slit or slits or openings within the spirit and the scope of the disclosure.

A pixel voltage may be applied to the pixel electrode PE in response to operation of the switching element. A common voltage may be applied to the common electrode CE. The arrangement or the orientation of liquid crystal molecules in the liquid crystal layer LC may be controlled by the application of an electric field formed by a voltage difference between the pixel voltage and the common voltage. As a result, light transmittance provided by a backlight assembly may be adjusted to display an image or images.

The switching element may include an active pattern AP including a channel layer CH, a gate electrode GE overlapping the active pattern AP, a source electrode SE electrically contacting or connecting the active pattern AP, and a drain electrode DE spaced apart from the source electrode SE and electrically contacting or connecting the active pattern AP. The drain electrode DE may be electrically connected to the pixel electrode PE.

The channel layer CH may include amorphous silicon, polycrystalline silicon, a metal oxide semiconductor or other material within the spirit and the scope of the disclosure. In an embodiment, the channel layer CH may include amorphous silicon, and the active pattern AP may include ohmic contact layers OC1 and OC2 for reducing a contact resistance with the source/drain electrodes SE and DE.

In an embodiment, the active pattern AP may cover or overlap an entire lower surface of the source and the drain electrodes SE and DE. A dummy pattern DP, which may be electrically connected to the active pattern AP and formed or disposed from a same layer as the active pattern AP, may be disposed under or below a data line DL. However, embodiments are not limited thereto. For example, the active pattern AP may partially overlap a lower surface of the source and the drain electrodes SE and DE depending on manufacturing processes.

In an embodiment, the opposing substrate 200 may include a base substrate 210, a color filter CF, a black matrix BM, an overcoat layer OCL, a common electrode CE and a second alignment layer AL2.

The color filter CF may overlap the pixel electrode PE. The black matrix BM may overlap a light-blocking area. The overcoat layer OCL may cover or overlap the color filter CF and the black matrix BM to planarize a surface of the opposing substrate 200. However, embodiments are not limited thereto. For example, at least one of the common electrode CE, the black matrix BM and the color filter CF may be disposed on the display substrate 100. As an example, the overcoat layer OCL may be omitted.

The display substrate 100 may include a gate line GL transferring a gate voltage to the gate electrode GE. For example, the gate line GL may extend along a first direction D1. The gate line GL may be formed from a same layer as the gate electrode GE.

The display substrate 100 may include a data line DL transferring a data voltage to the source electrode SE. For example, the data line DL may extend along a second direction D2 crossing the first direction D1. The data line DL may be formed from a same layer as the source electrode SE.

A source metal pattern including the data line DL, the source electrode SE and the drain electrode DE may have a multi-layered structure. In an embodiment, the source metal pattern may have a triple-layered structure. For example, the source metal pattern may include an upper layer UL containing or including titanium, an intermediate layer ML containing or including copper and a lower layer LL. For example, the upper layer UL may include titanium or a titanium alloy. The intermediate layer ML may include copper or a copper alloy. The lower layer LL may include titanium, molybdenum, tungsten or an alloy thereof.

For example, the titanium alloy may include titanium-zinc alloy, titanium-zinc-copper alloy or any other alloy within the spirit and the scope of the disclosure. The copper alloy may include aluminum, magnesium, manganese, beryllium, hafnium, niobium, tungsten, vanadium or a combination thereof in addition to copper.

In an embodiment, the upper layer UL may include titanium, and the intermediate layer ML may include copper, and the lower layer LL may include titanium.

The upper layer UL may reduce the reflectance of light incident to the display panel from the exterior. The intermediate layer ML may function as a main conductive layer. The lower layer LL may improve an adhesion between the intermediate layer ML and a substrate (or a layer) under or below the lower layer LL and may protect the intermediate layer ML. As an example, the upper layer UL may cover or overlap an entire upper surface of the intermediate layer ML. The upper layer UL may be referred to as a capping layer or a titanium-containing layer. The intermediate layer ML may be referred to as a main conductive layer or a copper-containing layer. The lower layer LL may be referred to as an adhesion-improving layer.

In an embodiment, a thickness of the upper layer UL may be in a range of about 100 Å to about 300 Å. A thickness of the intermediate layer ML may be in a range of about 1,000 Å to about 20,000 Å, and may be, for example, in a range of about 3,000 Å to about 7,000 Å. A thickness of the lower layer LL may be in a range of about 50 Å to about 500 Å.

For example, when a thickness of the upper layer UL is excessively or relatively small, the reflectance of external light may be hardly reduced. When a thickness of the upper layer UL is excessively or relatively large, it may be difficult to obtain a desired profile of the source metal pattern. When a thickness of the intermediate layer ML is excessively or relatively small, a conductivity of the source metal pattern may be reduced. When a thickness of the lower layer LL is excessively or relatively large, a distortion of the source metal pattern may be increased.

Figure 10:
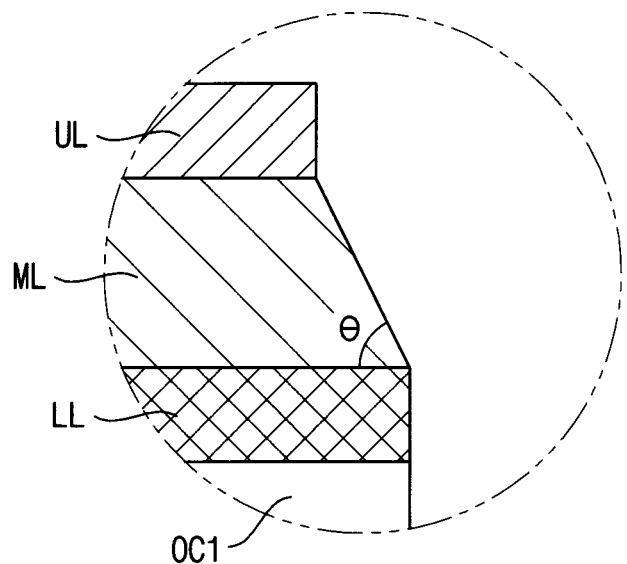
Figure 11:
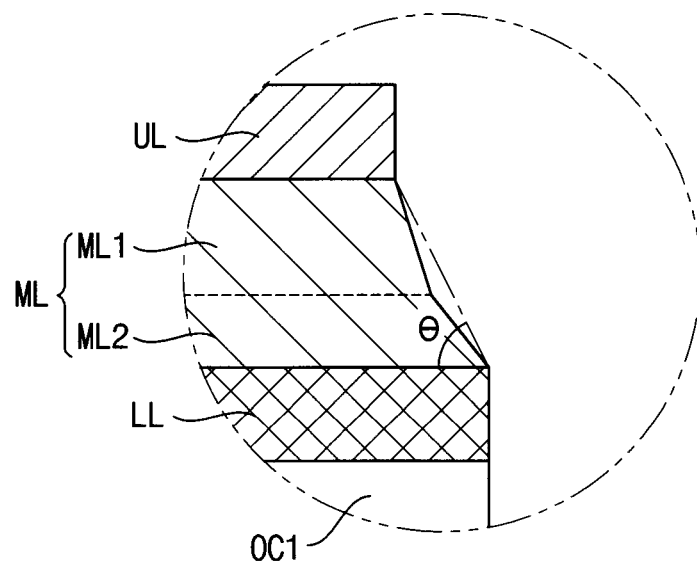

A taper angle Θ (as illustrated in FIGS. 10 and 11) of the source metal pattern may be defined by a taper angle of the intermediate layer ML, which may correspond to a main conductive layer. For example, a taper angle of the source metal pattern may be in a range of about 70° to about 90°. As an example, a taper angle of the source metal pattern may be in a range of about 70° to about 85°. As another example, a taper angle of the source metal pattern may be in a range of about 70° to about 80°.

In an embodiment, a metal pattern of a display device may include a low reflectance layer including titanium. Thus, reflectance of an external light by a metal pattern may be reduced thereby improving a display quality of a display device.

FIGS. 3 to 13 are schematic cross-sectional views illustrating a method for manufacturing a display device according to an embodiment.

Figure 3:
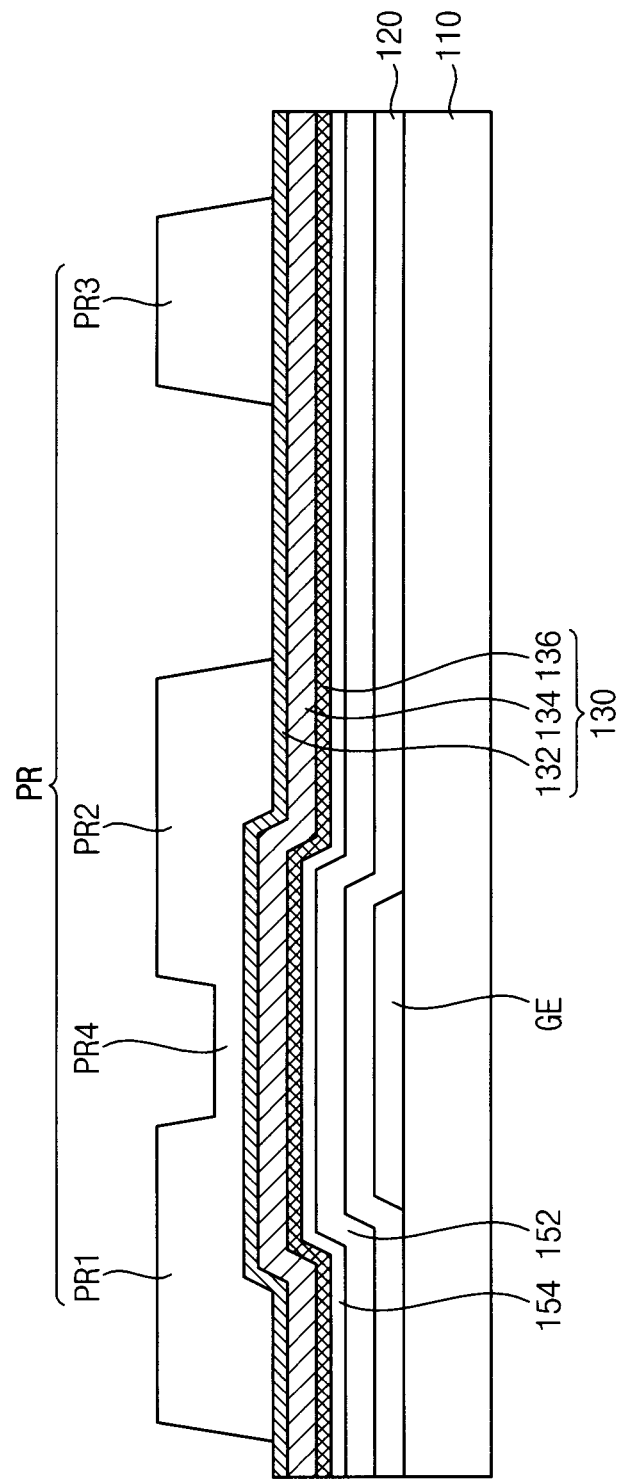
FIGS. 3 to 13 are schematic cross-sectional views illustrating a method for manufacturing a display device according to an embodiment.

Referring to FIG. 3, a gate metal pattern including a gate electrode GE may be formed or disposed on a base substrate 110. The gate metal pattern may include a gate line GL as illustrated in FIG. 1. The gate line GL may be continuously electrically connected to the gate electrode GE.

For example, the gate metal pattern may include gold, silver, aluminum, copper, nickel, platinum, magnesium, chromium, tungsten, molybdenum, titanium or an alloy thereof, and may have a single-layered structure or a multi-layered structure including different metal layers. In an embodiment, the gate metal pattern may include a main conductive layer including copper and a lower layer including titanium.

A gate insulation layer 120 may be formed or disposed to cover or overlap the gate metal pattern. For example, the gate insulation layer 120 may include silicon oxide, silicon nitride, silicon oxynitride, silicon carbide or a combination thereof.

An amorphous silicon layer 152 and a doped silicon layer 154 may be formed or disposed on the gate insulation layer 120. For example, the amorphous silicon layer 152 may be formed through a sputtering process or other process within the spirit and the scope of the disclosure. The doped silicon layer 154 may be formed by implanting impurities, such as n-type impurities, into the amorphous silicon layer 152 with a high concentration.

Thereafter, a source metal layer 130 may be formed or disposed on the doped silicon layer 154.

In an embodiment, the source metal layer 130 may have a triple-layered structure. For example, the source metal layer 130 may include an upper layer 132, an intermediate layer 134 and a lower layer 136. For example, the upper layer 132 may include titanium, the intermediate layer 134 may include copper, and the lower layer 136 may include titanium. For example, a thickness of the upper layer 132 may be in a range of about 100 Å to about 300 Å. A thickness of the intermediate layer 134 may be in a range of about 1,000 Å to about 20,000 Å. A thickness of the lower layer 136 may be in a range of about 50 Å to about 500 Å.

A photoresist pattern PR may be formed or disposed on the source metal layer 130. For example, a photoresist composition including a binder resin may be coated on the source metal layer 130. A coating layer may be exposed to a light and developed by a developing solution. Thus, the coating layer may be partially removed to form the photoresist pattern. The photoresist composition may be a positive type or a negative type photoresist composition. The binder resin may include a phenolic resin, a novolak resin, an acrylic resin or any other resin within the spirit and the scope of the disclosure.

The photoresist pattern PR may include a first portion PR1, a second portion PR2, a third portion PR3 and a fourth portion PR4. The fourth portion PR4 may be disposed between the first portion PR1 and the second portion PR2, and may have a smaller thickness than those of the first portion PR1, the second portion PR2 and the third portion PR3. However, the disclosure is not limited thereto. For example, the portions of the photoresist pattern PR may be arranged and/or include any thickness within the spirit and the scope of the disclosure. For example, the first portion PR1 may be referred to as a second portion PR2, etc., without departing from the spirit and the scope of the disclosure.

For example, the first portion PR1 may have a shape corresponding to a drain electrode. The second portion PR2 may have a shape corresponding to a source electrode. The third portion PR3 may have a shape corresponding to a data line. However, the disclosure is not limited thereto.

Figure 4:
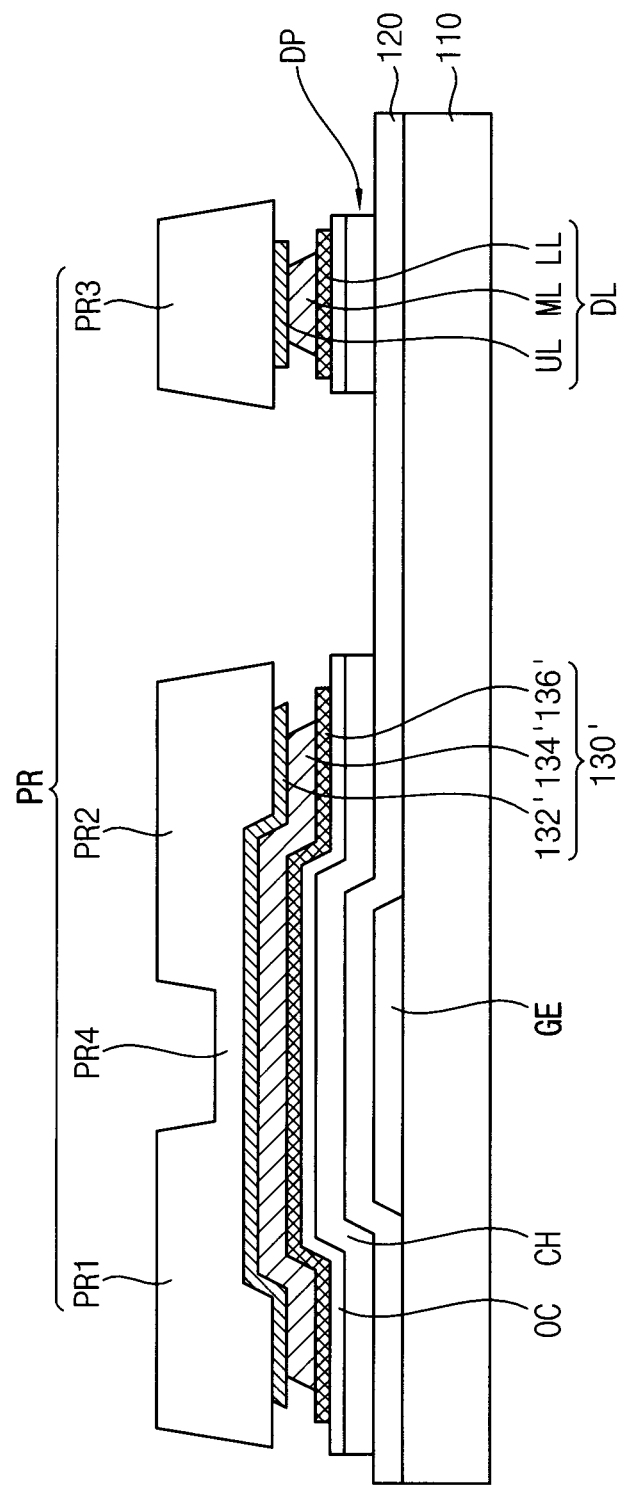

Referring to FIG. 4, the source metal layer 130 may be etched by application of the photoresist pattern PR as a mask. Thus, a portion of the source metal layer 130, which may be disposed under or below the photoresist pattern PR, may remain, and a remainder of the source metal layer 130 may be removed. As a result, a preliminary source pattern 130' may be formed or disposed under or below the first portion PR1, the second portion PR2 and the fourth portion PR4, and a data line DL may be formed or disposed under or below the third portion PR3.

The preliminary source pattern 130' may include an upper layer 132' including titanium, an intermediate layer 134' including copper and a lower layer 136' including titanium. The data line DL may include an upper layer UL including titanium, an intermediate layer ML including copper and a lower layer LL including titanium.

In an embodiment, the source metal layer 130 may be wet-etched. For example, each of the layers of the source metal layer 130 may be etched by a same etching composition.

In an embodiment, the etching composition may include persulfate, a chlorine-containing compound, a copper salt, a ring-shaped amine compound and/or an electron-donating compound.

For example, the persulfate may include ammonium persulfate $((NH_4)_2S_2O_8)$, sodium persulfate $(Na_2S_2O_8)$, potassium persulfate $(K_2S_2O_8)$ or a combination thereof. For example, the chlorine-containing compound may include hydrochloric acid, sodium chloride, potassium chloride, ammonium chloride or a combination thereof. For example, the copper salt may include copper nitrate $(Cu(NO_3)_2)$, copper sulfate $(CuSO_4)$, ammonium copper phosphate $(NH_4CuPO_4)$ or a combination thereof. For example, the ring-shaped amine compound may include a triazole compound, an aminotetrazole compound, an imidazole compound, an indole compound, a purine compound, a pyrazole compound, a pyridine compound, a pyrimidine compound, a pyrrole compound, a pyrrolidine compound, a pyrroline compound or a combination thereof. For example, the electron-donating compound may include riboflavin, folic acid, gallic acid, ascorbic acid, diethylenetriamine pentaacetic acid, N-acetyl L-cysteine, L-methionine, potassium L-ascorbate, calcium L-ascorbate, sodium L-ascobate or a combination thereof.

For example, the etching composition may include a range of about 0.5 wt % to about 20 wt % of the persulfate, a range of about 0.1 wt % to about 5 wt % of the chlorine-containing compound, a range of about 0.05 wt % to about 3 wt % of the copper salt, a range of about 0.5 wt % to about 5 wt % of the ring-shaped amine compound, a range of about 0.1 wt % to about 5 wt % of the electron-donating compound, and water. However, embodiments are not limited thereto, and various etching compositions, which may etch a titanium-containing layer and a copper-containing layer, may be used within the spirit and the scope of the disclosure.

The source metal layer 130 may include layers including different materials. Thus, a recess or a protrusion may be formed at etched surfaces of the preliminary source pattern 130' and the data line DL by a difference of etch rates, metal oxidation or the like. For example, the upper layers 132' and UL and the lower layers 136' and LL may protrude from a side surface of the intermediate layers 134' and ML in a lateral direction.

After the source metal layer 130 is etched, the doped silicon layer 154 and the amorphous silicon layer 152 may be etched by applying the photoresist pattern PR as a mask. As a result, an ohmic contact layer OC and a channel layer CH may be formed or disposed under or below the preliminary source pattern 130'. Furthermore, a dummy pattern DP may be formed or disposed under or below the data line DL. For example, the doped silicon layer 154 and the amorphous silicon layer 152 may be dry-etched.

Figure 5:
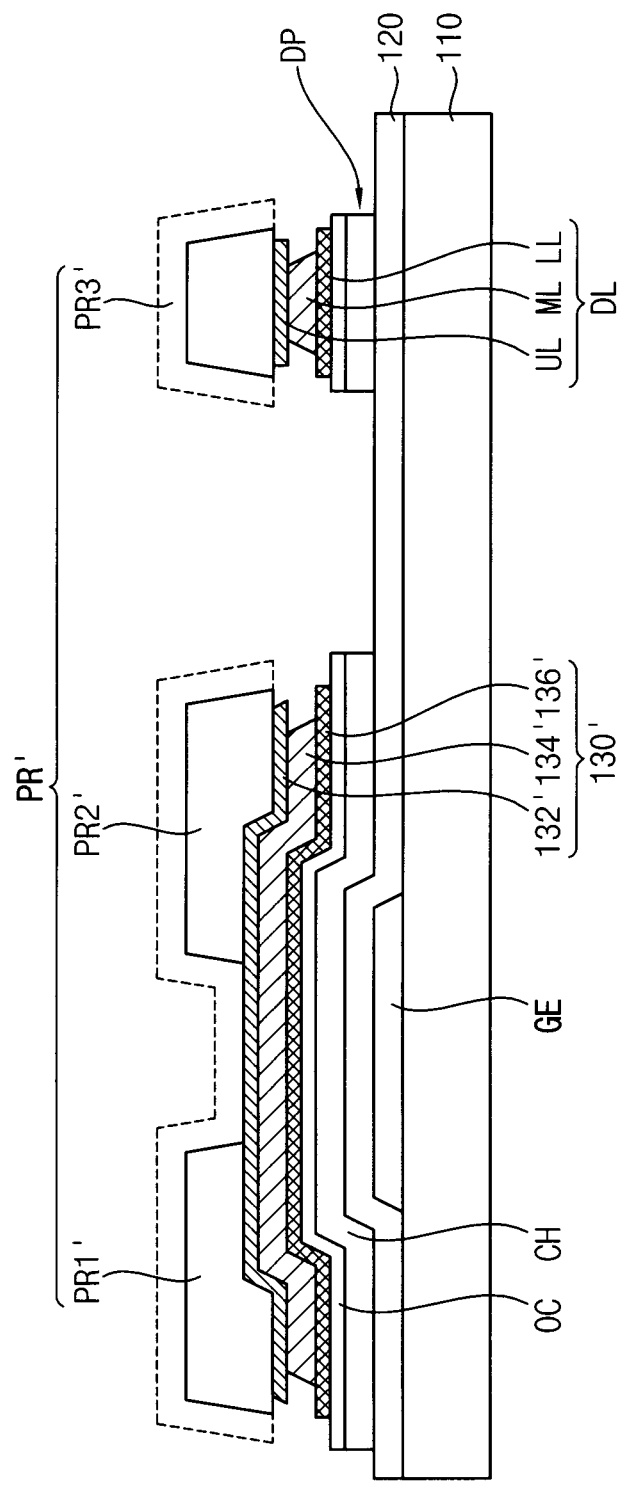

Referring to FIG. 5, the photoresist pattern PR may be partially removed through an etch-back process such as an ashing process to form a first remaining photoresist pattern PR'.

As a thickness of the photoresist pattern PR is reduced or entirely reduced, the fourth portion PR4 may be removed, and the preliminary source pattern 130' may be partially exposed where the fourth portion PR4 is removed.

As an example, a thickness and a width of the first portion PR1', the second portion PR2' and the third portion PR3' may be reduced.

Figure 6:
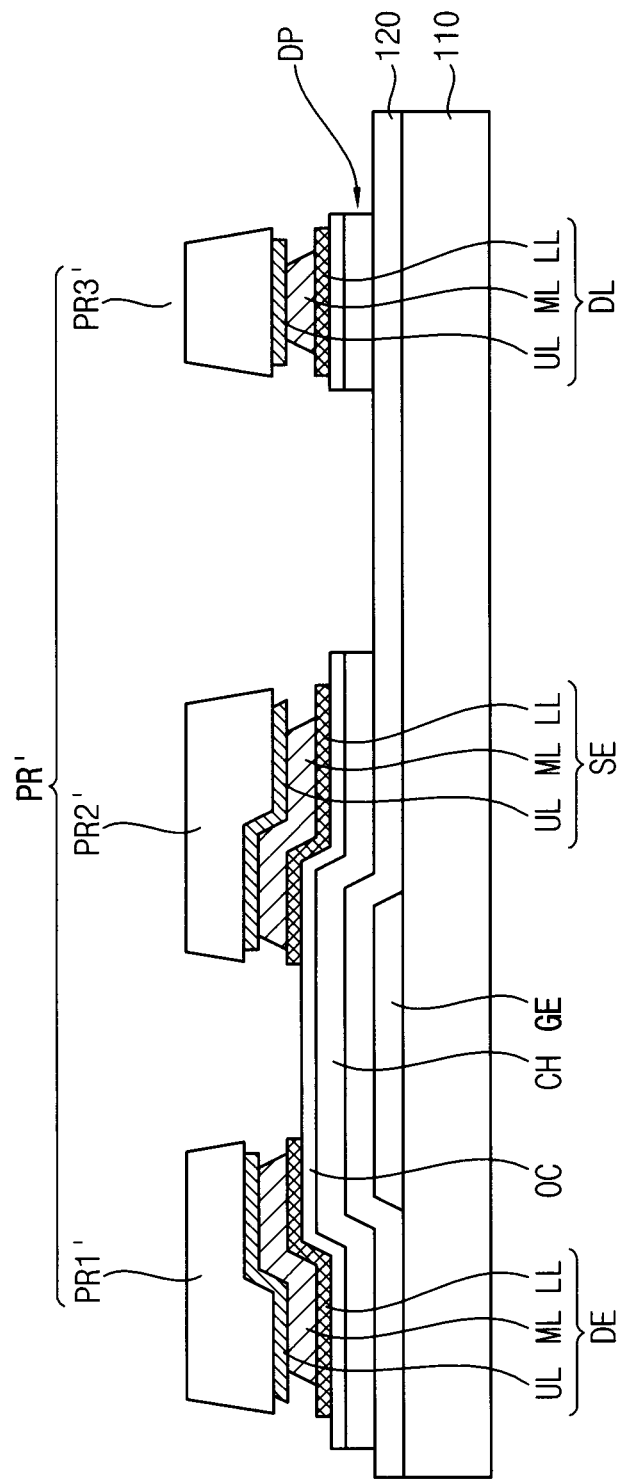

Referring to FIG. 6, an exposed portion of the preliminary source pattern 130' between the first portion PR1' and the second portion PR2' may be etched by applying the first remaining photoresist pattern PR' as a mask. As a result, a drain electrode DE may be formed or disposed under or below the first portion PR1', and a source electrode SE may be formed or disposed under or below the second portion PR2'. As an example, the ohmic contact layer OC may be exposed between the drain electrode DE and the source electrode SE.

For example, the preliminary source pattern 130' may be wet-etched by a same etching composition as the etching composition used for etching the source metal layer 130.

The drain electrode DE and the source electrode SE may respectively include an upper layer UL including titanium, an intermediate layer ML including copper and a lower layer LL including titanium. The drain electrode DE, the source electrode SE and the data line DL may be referred to as a source metal pattern.

As illustrated in FIG. 6, when the source metal pattern has an undercut structure due to a tip of the upper layer UL, a seam may be formed in a passivation layer (not illustrated) covering the source metal pattern. Such defect of the passivation layer may cause corrosion of the source metal pattern or other defects in subsequent processes. As an example, removing the tip of the upper layer UL including titanium may be difficult because of the or an oxidation of titanium.

According to an embodiment, the tip of the upper layer UL may be removed, and a profile of the source metal pattern may be improved or entirely improved. Thus, reflectance of external light upon a display device may be reduced. Reliability and a driving efficiency of the display device may be improved.

Figure 7:
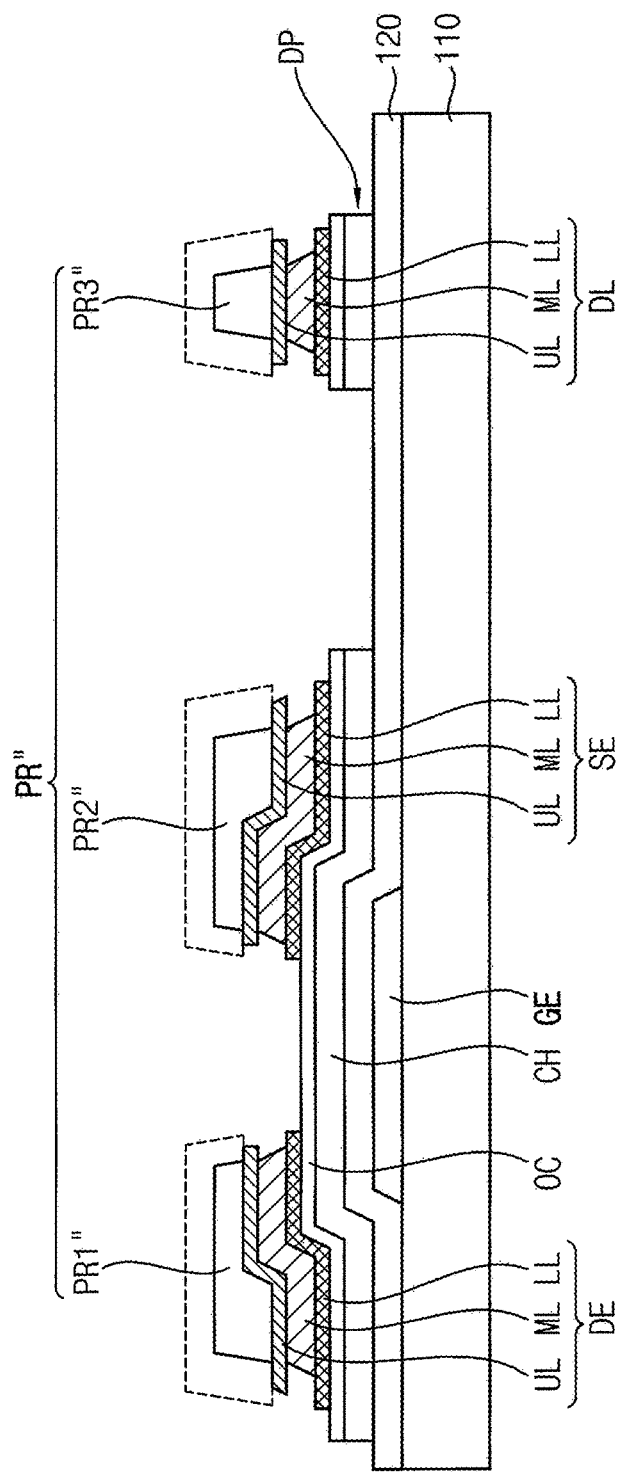

Referring to FIG. 7, the first remaining photoresist pattern PR' may be partially removed through an etch-back process such as an ashing process to form a second remaining photoresist pattern PR". As a size of the remaining photoresist pattern is reduced or entirely reduced, an upper surface of the tip of the upper layer UL of the source metal pattern may be exposed.

For example, the etch-back process may be performed such than an end of the second remaining photoresist pattern PR" may be adjacent to an end of an upper surface of the intermediate layer ML. In the etch-back process, the tip of the upper layer UL may be partially removed.

Figure 8:
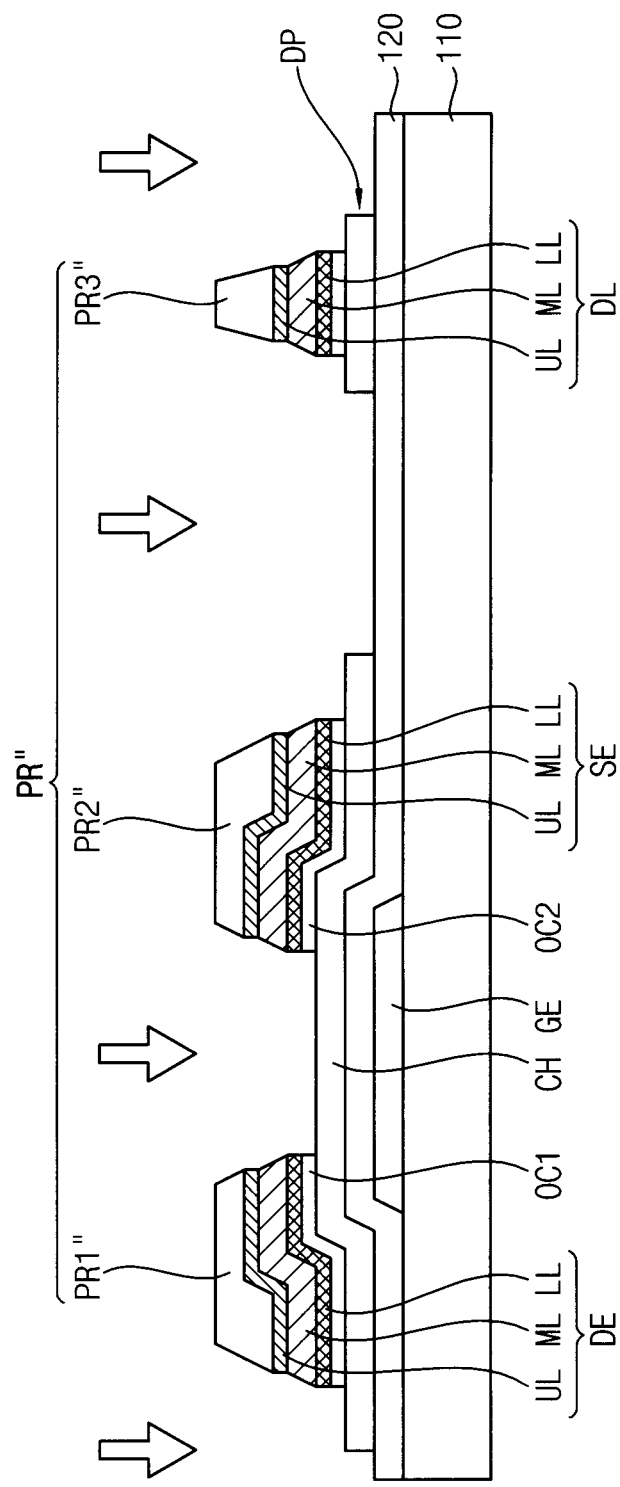

Referring to FIG. 8, a dry-etching process may be performed by application of the second remaining photoresist pattern PR" as a mask.

The upper tip of the source metal pattern may be removed or entirely removed through the dry-etching process. A taper angle of the source metal pattern may be increased. A portion of the ohmic contact layer OC between the source electrode SE and the drain electrode DE may be removed. As a result, an upper surface of the channel layer CH may be partially exposed so that a channel of the active pattern may be defined.

For example, an etching gas including a fluorine-containing compound may be used in the dry-etching process. In an embodiment, the etching gas may include the fluorine-containing compound and a chlorine-containing compound.

For example, the fluorine-containing compound may include $SF_6$, $NF_3$, $CF_4$ or a combination thereof. For example, the chlorine-containing compound may include $Cl_2$, $BCl_3$ or a combination thereof. In an embodiment, the etching gas may include $SF_6$ and $Cl_2$. The etching gas may be used with a carrier gas such as helium gas, argon gas or other gas within the spirit and the scope of the disclosure.

In an embodiment, when the etching gas includes $SF_6$ and $Cl_2$, a flow ratio of $SF_6$ and $Cl_2$ may be in a range of about 1:9 to about 3:7. When a flow of $Cl_2$ is excessively or relatively large, a taper angle of the source metal pattern may be reduced.

In an embodiment, the dry-etching process may include a first dry-etching process and a second dry-etching process, which may be performed under different conditions.

For example, the first dry-etching process may use a first etching gas including $SF_6$ and $Cl_2$. A flow ratio of $SF_6$ and $Cl_2$ may be in a range of about 1:9 to about 2:8 in the first etching gas. The upper tip of the source metal pattern may be mainly removed through the first dry-etching process.

For example, the second dry-etching process may use a second etching gas including $SF_6$ and $Cl_2$. A flow ratio of $SF_6$ and $Cl_2$ may be in a range of about 2:8 to about 3:7 in the second etching gas. The intermediate layer ML and the lower layer LL of the source metal pattern may be further etched through the second dry-etching process thereby increasing a taper angle of the source metal pattern. A portion of the ohmic contact layer OC between the source electrode SE and the drain electrode DE may be removed to expose the channel layer thereunder through the second dry-etching process.

According to an embodiment, a ratio of the fluorine-containing compound may be lower in the first etching gas for the first dry-etching process than in the second etching gas for the second dry-etching process. Such ratio variance may prevent damage to the channel layer, and may effectively remove the upper tip of the source metal pattern, and may increase a taper angle of the source metal pattern.

Figure 9:
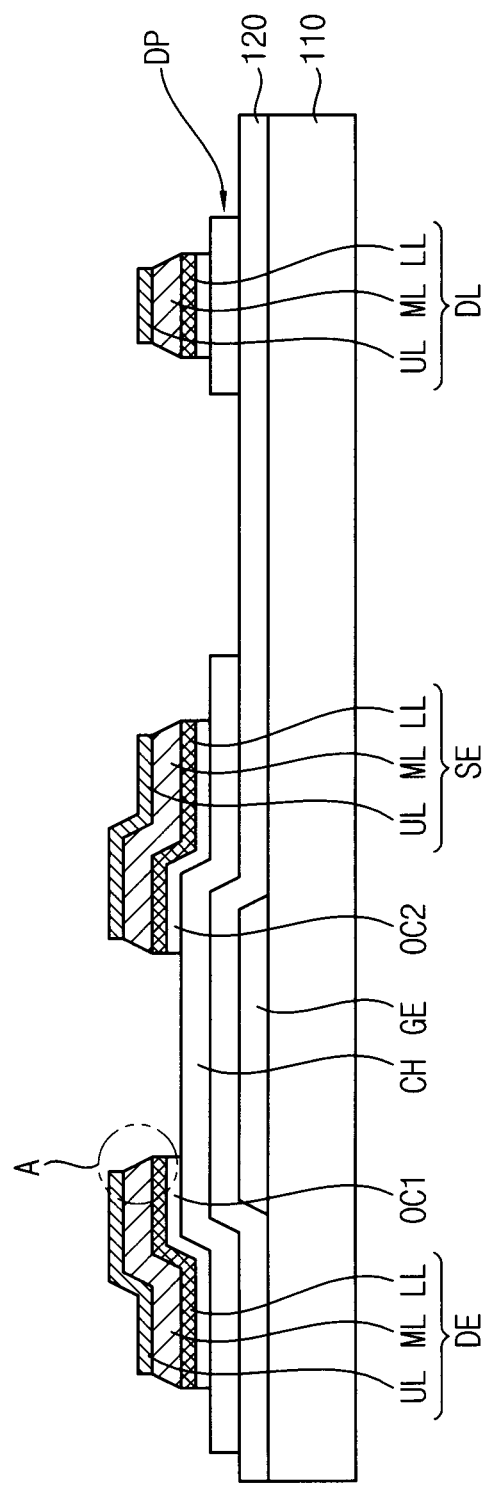

Referring to FIG. 9, the second remaining photoresist pattern PR" may be removed. For example, the second remaining photoresist pattern PR" may be removed by an ashing process, a stripper solution or other removal process without departing from the spirit and the scope of the disclosure.

FIGS. 10 and 11 are enlarged schematic cross-sectional views illustrating a source metal pattern formed according to embodiments. FIGS. 10 and 11 may illustrate the region 'A' of FIG. 9.

Referring to FIG. 10, a taper angle θ of the source metal pattern may be defined by a taper angle of the intermediate layer ML, which may correspond to a main conductive layer. For example, a taper angle θ of the source metal pattern may be in a range of about 70° to about 90°. For example, a taper angle θ of the source metal pattern may be in a range of about 70° to about 85°. As another example, a taper angle θ of the source metal pattern may be in a range of about 70° to about 80°. However, embodiments are not limited thereto, and ranges for the taper angle may be varied.

Referring to FIG. 11, the intermediate layer ML of the source metal pattern may have a multi-tapered structure. For example, the intermediate layer ML of the source metal pattern may include a first portion and a second portion, which may have different taper angles from each other. The second portion may be defined by an arbitrary region disposed under or below the first portion. For example, a first taper angle of the first portion may be larger than a second taper angle of the second portion. However, the disclosure is not limited thereto.

For example, an upper portion ML1 and a lower portion ML2 of the intermediate layer ML may have different taper angles from each other. In an embodiment, a taper angle of the upper portion ML1 may be larger than a taper angle of the lower portion ML2. An overall taper angle θ of the source metal pattern having a multi-tapered structure may be defined by an angle between a lower surface of the intermediate layer ML and a line connecting an end of the lower surface to an end of an upper surface.

The multi-tapered structure may have various shapes depending on conditions of the etch-back process and the dry-etching process. For example, the first portion may be an uppermost region of the intermediate layer ML, and the second portion may be a lowermost region of the intermediate layer ML, and at least one portion having a different taper angle from the first portion and the second portion may be interposed between the first portion and the second portion.

The multi-tapered structure may increase a taper angle θ of the source metal pattern without reducing adhesion of the main conductive layer.

Figure 12:
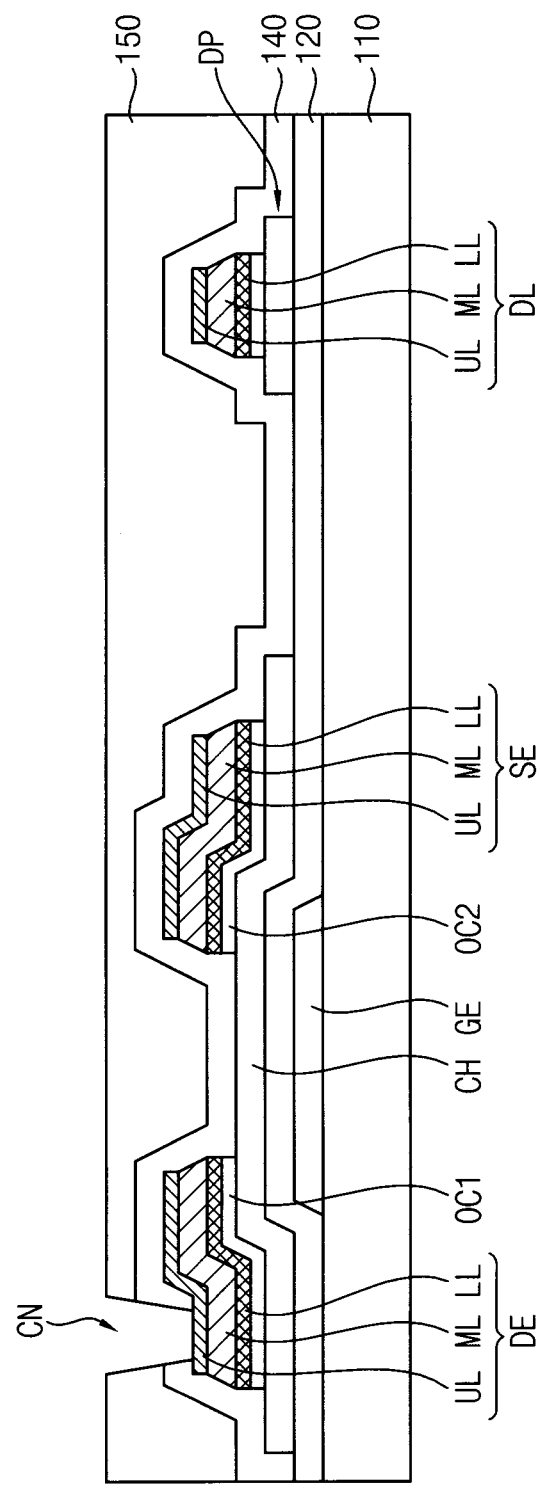

Referring to FIG. 12, a passivation layer 140 may be formed or disposed to cover or overlap the source metal pattern including the source electrode SE, the drain electrode DE and the data line DL. For example, the passivation layer 140 may include silicon oxide, silicon nitride, silicon oxynitride, silicon carbide or a combination thereof.

A planarizing layer 150 may be formed or disposed on the passivation layer 140. The planarizing layer 150 may include an organic insulation material. For example, the planarizing layer 150 may be formed or disposed from a photoresist composition including a binder resin such as a phenolic resin, an acrylic resin, benzocyclobutene, an epoxy resin or other materials within the spirit and the scope of the disclosure.

The passivation layer 140 and the planarizing layer 150 may be patterned to form a contact hole CN exposing a portion of the drain electrode DE.

Figure 13:
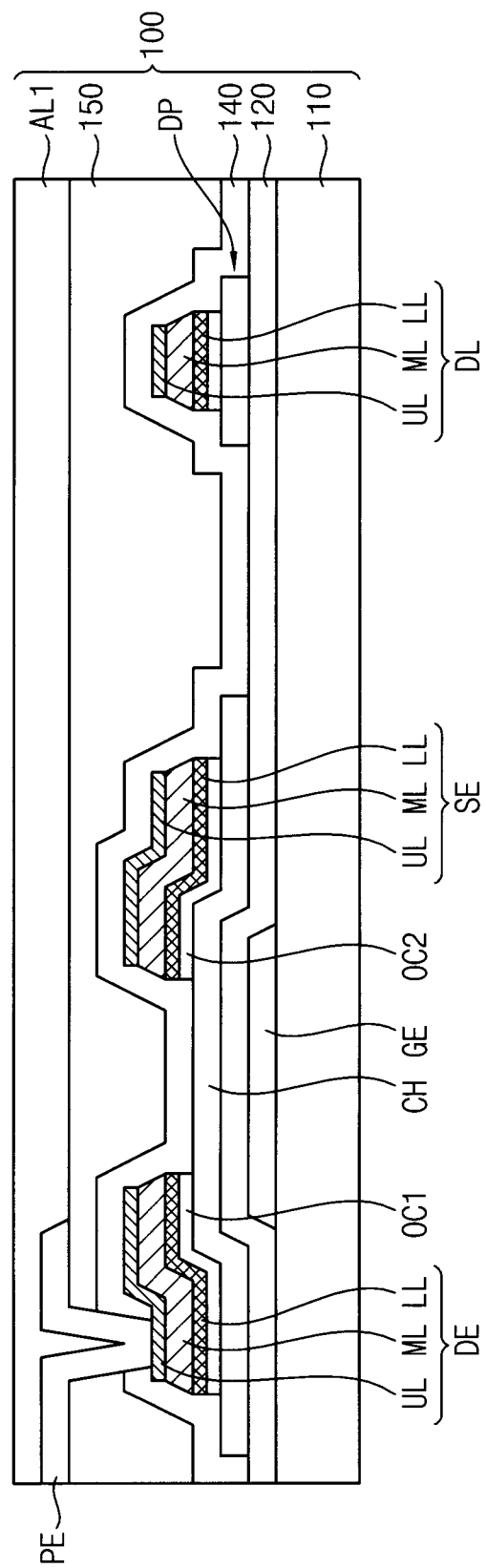

Referring to FIG. 13, a pixel electrode PE may be formed that may electrically contact the drain electrode DE. The pixel electrode PE may include a transparent conductive oxide such as indium tin oxide, indium zinc oxide or other transparent conductive oxide.

A first alignment layer AL1 may be formed or disposed on the pixel electrode PE. The first alignment layer AL1 may include a polymer such as polyimide or other polymers, and may be treated by rubbing, light-exposure or other treatments to have a predetermined orientation and/or tilting angle.

The display substrate 100 may be combined with the opposing substrate 200 as illustrated in FIG. 2.

According to an embodiment, an upper tip of a metal pattern having a multi-layered structure including an upper layer containing titanium and a lower layer containing copper may be effectively removed.

As an example, a taper angle of the metal pattern may be increased thereby improving characteristics for a signal wiring.

Embodiments are not limited to the previously explained embodiments. For example, embodiments may be applied for other metal patterns than the source metal pattern. For example, the metal pattern having a multi-layered structure may be a signal wiring such as a gate line or other lines or wirings. Embodiments are not limited to a liquid crystal display device. For example, embodiments may be applied for forming a metal wiring of an organic light-emitting display device.

Figure 14:
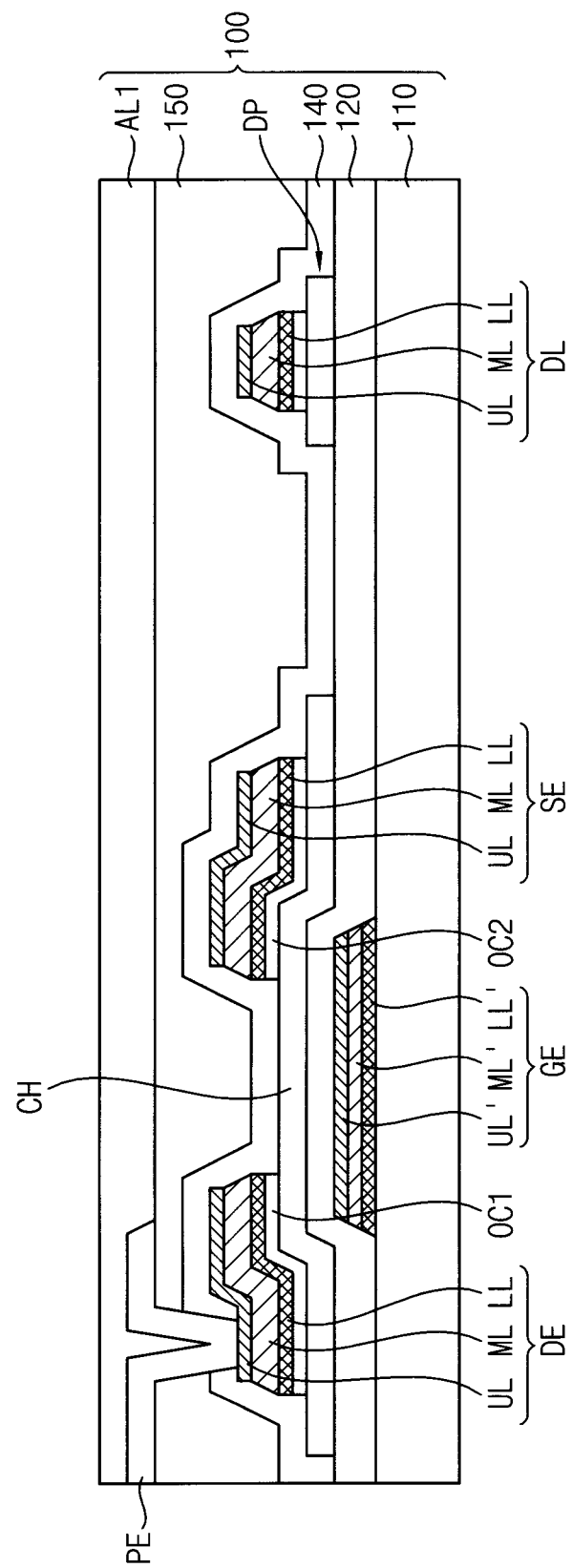
FIGS. 14 and 15 are schematic cross-sectional views illustrating a display device according to embodiments.
Figure 15:
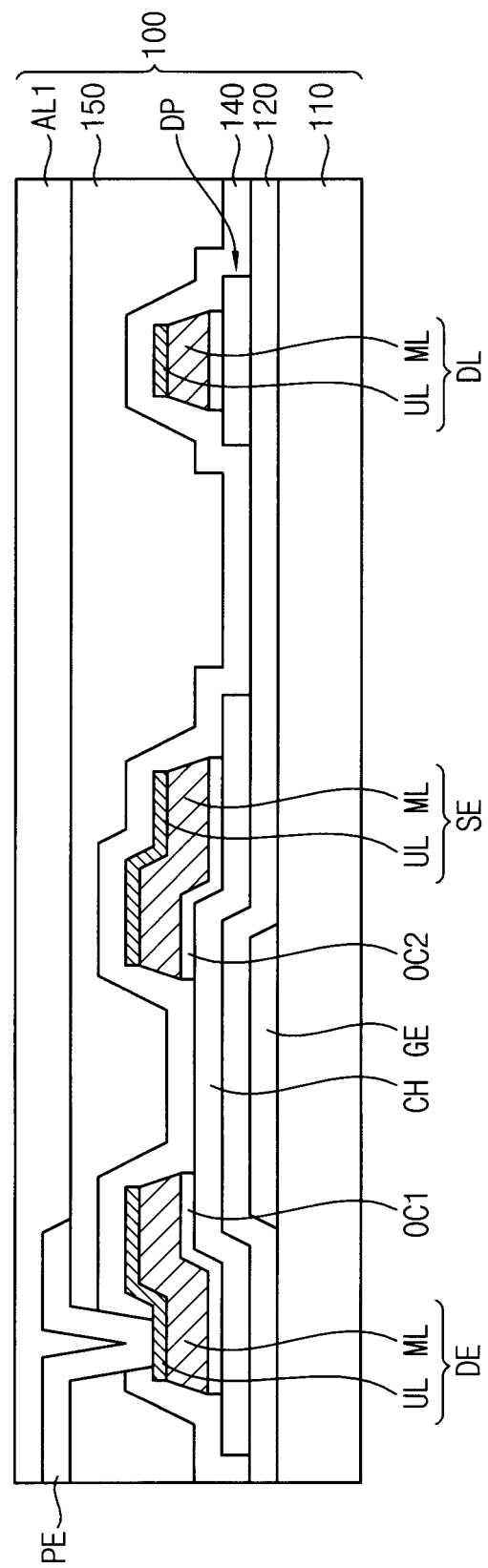

FIGS. 14 and 15 are schematic cross-sectional views illustrating a display device according to embodiments.

Referring to FIG. 14, a display substrate 100 may include a switching element, a gate line transferring a gate voltage to the switching element, a data line DL transferring a data voltage to the switching element and a pixel electrode PE electrically connected to a drain electrode DE of the switching element.

The switching element may include an active pattern including a channel layer CH, a gate electrode GE overlapping the active pattern, a source electrode SE electrically contacting the active pattern and a drain electrode DE electrically contacting the active pattern and the pixel electrode PE.

In an embodiment, a gate metal pattern including the gate electrode GE and the gate line may have a multi-layered structure. For example, the gate metal pattern may have a triple-layered structure. For example, the gate metal pattern may include an upper layer UL' containing titanium, an intermediate layer ML' containing copper and a lower layer LL' containing titanium.

In an embodiment, a taper angle of the gate metal pattern may be smaller than a taper angle of a source metal pattern. However, the disclosure is not limited thereto.

According to an embodiment, the gate metal pattern may include a low reflectance layer including titanium. Thus, reflectance of external light by a metal pattern may be reduced thereby improving a display quality of a display device.

Referring to FIG. 15, a source metal pattern including a source electrode SE, a drain electrode DE and a data line DL may have a double-layered structure. For example, the source metal pattern may include an upper layer UL containing titanium and a lower layer LL containing copper. The lower layer LL may be a main conductive layer, which may have a thickness larger than the upper layer UL.

As illustrated in FIG. 15, a metal pattern may have a double-layered structure in an embodiment.

Hereinafter, effects of embodiments will be explained and shown with reference to examples and experiments.

EXAMPLE 1

A multi-layered structure including a lower titanium layer with a thickness of about 200 Å, a copper layer with a thickness of about 7,000 Å disposed on the lower titanium layer and an upper titanium layer with a thickness of about 200 Å disposed on the copper layer was formed or disposed on a substrate.

A photoresist pattern was formed or disposed on the multi-layered structure, and an exposed portion of the multi-layered structure was wet-etched.

Thereafter, an etch-back process was performed for about 45 seconds under a condition of about: 250 mT, 1K Watt, 50 sccm of $SF_6$ and 500 sccm of oxygen gas to partially remove the photoresist pattern.

Thereafter, a first dry-etching process was performed for about: 60 seconds under a condition of about: 250 mT, 0.5K Watt, 60 sccm of $SF_6$, 340 sccm of chlorine gas and 400 sccm of helium gas with a plasma etching mode. Thereafter, a second dry-etching process was performed for about 60 seconds under a condition of about: 250 mT, 0.5K Watt, 100 sccm of $SF_6$, 300 sccm of chlorine gas and 400 sccm of helium gas with a plasma etching mode.

Figure 16A:
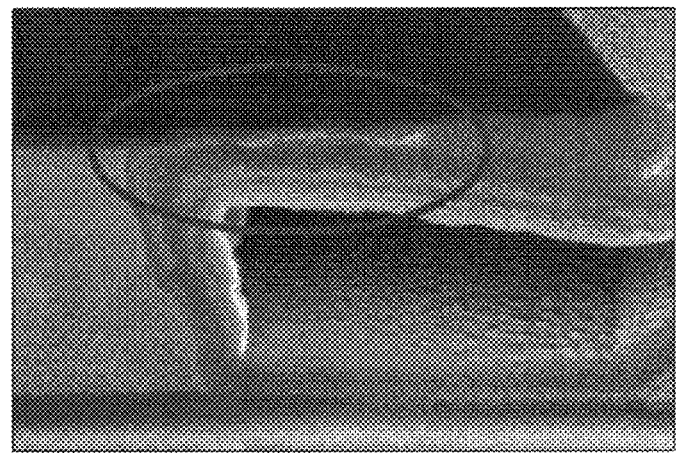
FIG. 16A is a scan electron microscopy (SEM) picture showing a profile of a multi-layered metal pattern, which has been wet-etched, before performing a etch-back process, in Example 1.
Figure 16B:
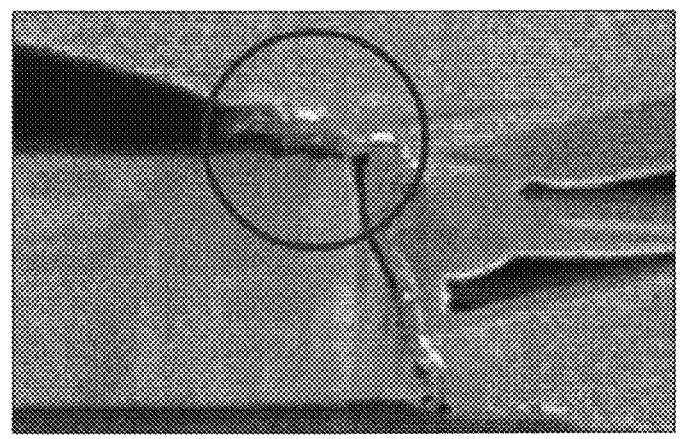
FIG. 16B is an SEM picture showing a profile of a multi-layered metal pattern, which has been secondly dry-etched, in Example 1.

FIG. 16A is a scan electron microscopy (SEM) picture showing a profile of a multi-layered metal pattern, which has been wet-etched, before performing an etch-back process, in Example 1. FIG. 16B is an SEM picture showing a profile of a multi-layered metal pattern, which has been secondly dry-etched, in Example 1.

Referring to FIGS. 16A and 16B, a wet-etched multi-layered metal pattern had a tip formed by a protrusion of the upper layer. However, the tip was removed by the etch-back process and the dry-etching processes. Furthermore, it can be noted that a taper angle of the multi-layered metal pattern was increased, and a copper layer (main conductive layer) having a double-tapered structure was formed through the dry-etching processes.

Embodiments may be applied to various display devices and a method for manufacturing the display devices. For example, embodiments may be applied to a vehicle-display device, a ship-display device, an aircraft-display device, portable communication devices, display devices for display or for information transfer, a medical-display device, or other devices without departing from the spirit and the scope of the disclosure.

The foregoing is illustrative of embodiments and is not to be construed as limiting thereof. Although embodiments have been described, those skilled in the art will readily appreciate that many modifications are possible in the embodiments without materially departing from the novel teachings and features of the disclosure. Accordingly, all such modifications are intended to be included within the scope of the disclosure. Therefore, it is to be understood that the foregoing is illustrative of various embodiments and is not to be construed as limited to the embodiments disclosed, and that modifications to the disclosed embodiments, as well as other embodiments, are intended to be included within the scope of the disclosure, as set forth in the following claims and equivalents thereof.

What is claimed is:

1. A method for manufacturing a display device, the method comprising:
   forming a doped silicon layer on an amorphous silicon layer;
   forming a source metal layer on the doped silicon layer, the source metal layer including a copper-containing layer and a titanium-containing layer on the copper-containing layer;
   forming a photoresist pattern on the source metal layer;

wet-etching the source metal layer by applying the photoresist pattern as a mask to form a preliminary source pattern and a data line;

partially removing the photoresist pattern to partially expose an upper surface of the preliminary source pattern and to form a first remaining photoresist pattern;

wet-etching the preliminary source pattern by applying the first remaining photoresist pattern as a mask to form a source electrode and a drain electrode and to partially expose an upper surface of the doped silicon layer;

partially removing the first remaining photoresist pattern to expose an upper tip of a multi-layered source metal pattern including the source electrode, the drain electrode, and the data line and to form a second remaining photoresist pattern; and dry-etching the multi-layered source metal pattern with an etching gas by applying the second remaining photoresist pattern as a mask to remove the upper tip of the multi-layered source metal pattern, wherein the dry-etching of the multi-layered source metal pattern includes a first dry-etching followed by a second dry-etching, the etching gas includes a fluorine-containing compound and a chlorine-containing compound, and the first dry-etching and the second dry-etching have different flow ratios of the fluorine-containing compound and the chlorine-containing compound.

2. The method of claim 1, wherein
the fluorine-containing compound includes at least one of $SF_6$, $NF_3$ and $CF_4$, and
the chlorine-containing compound includes at least one of $Cl_2$ and $BCl_3$.

3. The method of claim 1, wherein the etching gas includes $SF_6$ and $Cl_2$.

4. The method of claim 1, wherein each of the flow ratios of the fluorine-containing compound and the chlorine-containing compound is in a range of about 1:9 to about 3:7.

5. The method of claim 1, wherein
a flow ratio of the fluorine-containing compound and the chlorine-containing compound is in a range of about 1:9 to about 2:8 when performing the first dry-etching, and
a flow ratio of the fluorine-containing compound and the chlorine-containing compound is in a range of about 2:8 to about 3:7 when performing the second dry-etching.

6. The method of claim 1, wherein the doped silicon layer is partially removed to expose the amorphous silicon layer when dry-etching the multi-layered source metal pattern.

7. The method of claim 1, wherein the source metal layer includes an adhesion-improving layer including at least one of titanium, molybdenum and tungsten and disposed below the copper-containing layer.

8. The method of claim 7, wherein
the multi-layered source metal pattern has a taper angle in a range of about 70° to about 90°,
a thickness of the titanium-containing layer is in a range of about 100 Å to about 300 Å,
a thickness of the copper-containing layer is in a range of about 1,000 Å to about 20,000 Å, and
a thickness of the adhesion-improving layer is in a range of about 50 Å to about 500 Å.

9. The method of claim 1, wherein
the first dry-etching removes a tip of the titanium-containing layer of the source metal pattern; and
the second dry-etching increases a taper angle of the copper-containing layer of the source metal pattern.

* * * * *